United States Patent [19]

Miyazaki et al.

[11] Patent Number: 4,603,406
[45] Date of Patent: Jul. 29, 1986

[54] POWER BACKED-UP DUAL MEMORY SYSTEM

[75] Inventors: Yoshihiro Miyazaki, Hitachi; Kenkichi Yamashita, Katsuta, both of Japan

[73] Assignee: Hitachi, Ltd., Tokyo, Japan

[21] Appl. No.: 576,719

[22] Filed: Feb. 3, 1984

[30] Foreign Application Priority Data

Feb. 4, 1983 [JP] Japan ................................. 58/16035

[51] Int. Cl.⁴ ............................................. C11C 11/40
[52] U.S. Cl. ..................................... 365/229; 365/226
[58] Field of Search ................................ 365/226, 229

[56] References Cited

U.S. PATENT DOCUMENTS 3,859,638  1/1975  Hume et al. ......................... 365/229
4,399,524  8/1983  Muguruma et al. ................ 365/229
4,422,163  12/1983  Oldenkamp ......................... 365/229

Primary Examiner—Terrell W. Fears
Attorney, Agent, or Firm—Antonelli, Terry & Wands

[57] ABSTRACT

A dual memory system consists of two memory units each having volatile memory devices, backup power storage means and backup monitoring facility which memorizes a signal indicative of whether backup is successful or failing. When the contents of one memory unit are copied to another memory unit, the receiving memory unit has the monitor signal in a state which is made coincident with the signal state of the sending memory unit. Consequently, the receiving memory unit will have the same state of the monitor signal as of the sending memory unit at the end of copying, and thus both memory units are in a successful backup state only when the sending memory unit is in a successful backup state.

6 Claims, 9 Drawing Figures

POWER BACKED-UP DUAL MEMORY SYSTEM

The present invention relates to a dual memory system of the types which is accessed by one or more processing units and, more particularly, to a dual memory system in which each memory unit is operable by the independent power supply backed up by a power storage means against a possible power failure.

A typical power storage means is a battery. The battery backup system, which is most commonly employed in computer systems, is operable in the case of failure of the ordinary power supply to protect stored information in the memory such as, semiconductor memory a which loses its stored contents if the power supply is suspended. This type of memory, which cannot retain the contents when power is removed, is known as a volatile memory, while a memory device such as core memory is not a volatile memory.

Owing to the recent advances in semiconductor technology, semiconductor memory devices which retain their contents in a power-off state are becoming practicable, but the dominant memory devices in use today are of the volatile type, and many parts of memory systems are provided with battery backup systems.

In many cases, the memory of a computer system is configured as a dual system for the purpose of enhancing the system reliability. In order for both memory units in the dual memory system to be used as shared memory units associated with a plurality of processing units (termed simply CPUs), it is necessary for the memory units to have separate power systems. Namely, in the event of a power failure of one memory unit, another memory unit operating under the separate power system can maintain the normal system operation.

Conventionally, non-volatile memory devices such as a core memory, have commonly been used in shared dual memory systems. However, the cost of semiconductor memory devices has fallen sharply owing to the advanced semiconductor technology, and a long life battery has become available for volatile semiconductor memory devices, therefore, core memory units are increasingly being replaced by volatile semiconductor memory units.

In the conventional battery backup system, a signal is produced to indicate whether or not battery backup has taken place successfully, so that the CPU determines the validity of data read out from the battery backed-up memory unit with reference to the signal. If the supply voltage to the memory is lost during the backup operation, this signal will hold to indicate the state of the failure. If the signal indicates the failure of the battery backup for the memory unit, the CPU does not use data from the memory unit, but takes appropriate action, such as generating an operator call. This system, however, has a problem that two battery backup systems provided for two memory units in a dual memory system might produce inconsistent signals indicating a success or failure of the backup operation. Let us assume that it is a successful operation if at least one of the backup systems has succeeded. When the power supply is recovered, the time of the recovery for one memory system differs strictly from that for another memory system. It is a general way for keeping the same memory contents in the dual backup systems that the content of one memory is copied to another memory at the time of recovery of the power supply. If one system with the earlier power supply has failed and another system with a later power supply has succeeded, the contents of the former memory unit will be copied into the latter memory unit, resulting inconsistently in a destruction of the contents of the latter memory unit. On the other hand, in case backup is assumed to be failing when one of backup systems has failed, both memory contents are invalidated due to the failure of one system, resulting disadvantageously in a low reliability of the dual memory system.

It is an object of the present invention to provide a power backed-up dual memory system consisting of two memory units each including volatile memory devices and a backup power storage means, wherein the above-mentioned improper results are avoided when both units show inconsistent backup states. One feature of the present invention is that when data in one memory unit is copied to another memory unit in a dual memory system, the signal indicating the success or failure of the power backup produced by the receiving memory unit is made coincident with the signal produced by the sending memory unit.

According to one aspect of the present invention, each memory unit is provided in connection to a common bus with CPU ports for data transfer between CPUs and memory, a copy port for data transfer between two memory units within the dual memory system, and a backup monitoring facility for memorizing whether battery backup has succeeded or failed, the contents of the backup monitoring facility being varied arbitrarily by the signal on the common bus. This battery backup system is useful in many computer memories and especially in the control computers.

Other objects and features of the present invention will be apparent from the following detailed description of a preferred embodiment taken in conjunction with the accompanying drawings, in which.

Figure 1:
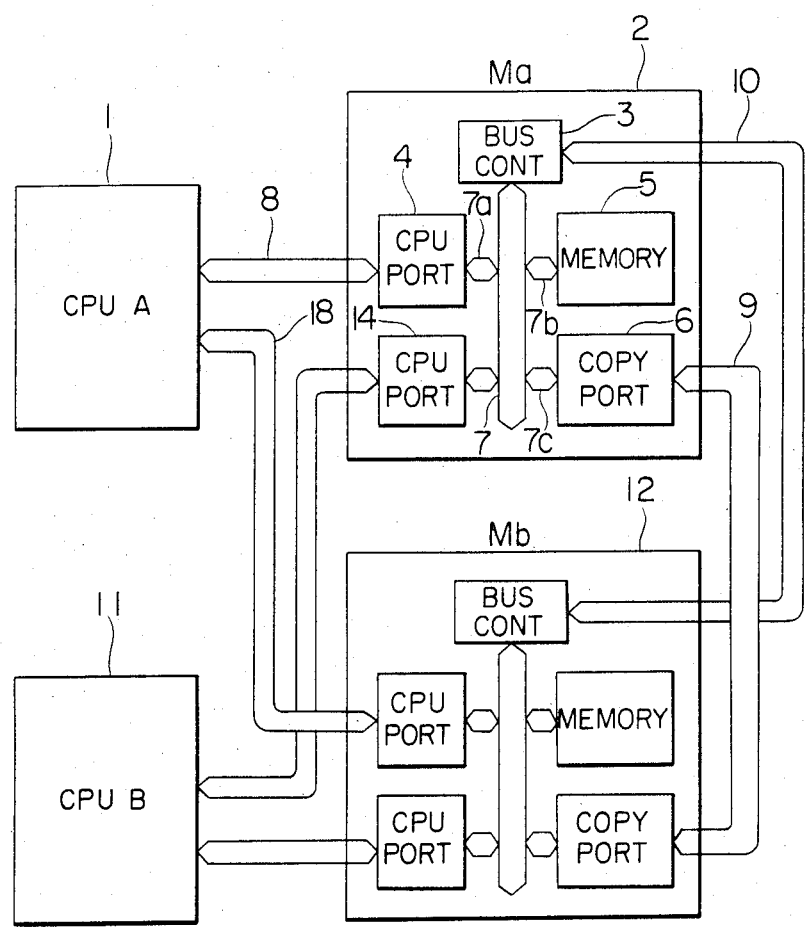
FIG. 1 is a general block diagram showing the shared dual memory system according to the present invention.

In FIG. 1 showing, as an example, the overall arrangement of the shared dual memory system to which the present invention is applied, CPUs (CPU-A, CPU-B) 1 and 11 and shared memory units (Ma, Mb) 2 and 12 are connected on interface buses 8 provided between CPUs and memory. The memory contents of the unit Ma is usually the same as that of the unit Mb. Each CPU has two interface buses 8 and 18, one connected to the shared memory unit (Ma) 2 and another to the shared memory unit (Mb) 12. The memory units (Ma, Mb) 2 and 12 are interconnected through a copy interface bus 9 and synchronization interface bus 10. Each of the memory units (Ma, Mb) 2 and 12 consists of a bus controller (BUS CONT.) 3, CPU attachments (CPU PORT) 4 (same in number as of CPUs), memory block with battery backup facility (M) 5, and copy attachment (COPY PORT) 6, all connected on a common bus 7. The two memories use regulated d.c. power rectified from the AC power when it is normally supplied. The CPU attachments 4 are connected to the CPU-memory interface buses 8, the bus controller 3 is connected to the synchronization interface bus 10, and the copy attachment 6 is connected to the copy interface bus 9.

Both memory units are accessed simultaneously for reading and writing data, and one of the read-out data without the occurrence of error is selected by the CPU.

The bus controller 3 functions to solve contention of memory requests from the CPU attachments 4 and copy attachment 6 and to synchronize the operations of the memory units 2 and 12. The detailed description of the bus controller 3 will not be given here, since it is not directly related to the present invention.

Figure 2:
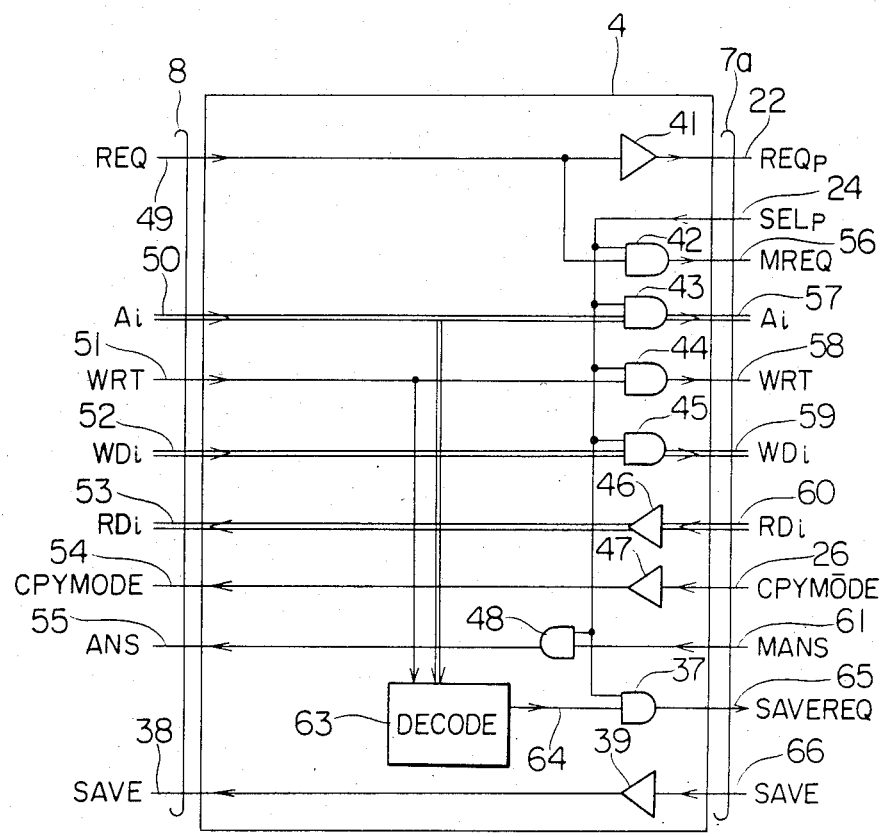
FIG. 2 is a schematic diagram showing one embodiment of the CPU port 4 in the memory unit shown in FIG. 1.

FIG. 2 shows in detail an embodiment of the CPU attachment 4. The arrangement includes AND gates 42-45, 48, and 37, buffers 41, 46, 47, and 39, and a decoder 63. A memory request signal (REQ) 49 issued by a CPU is applied through the buffer 41 to become a bus request signal (REQp) 22. The bus controller 3 selects one of active request signals from the CPU attachments 4 and 14 and copy attachment 6, and, if the CPU attachment 4 is selected, provides a request signal (REQp) for a common bus 7a. The bus controller 3 selects one among these request signals from the CPU attachments 4 and a request signal from the copy attachment 6. If the CPU attachment 4 is selected, the enable signal (SELp) is active on line 24. The AND gate 42 responds to this signal to make a memory activation signal (MREQ) 56 active. Address signals (Ai) 50, write signal (WRT) 51 and write data signals (WDi) 52 are applied through corresponding AND gates 43, 44 and 45, so that address signals (Ai) 57, write signal (WRT) 58 and write data signals (WDi) 59 are produced on a common bus 7a. The decoder (DECODE) 63 provides an output signal 64, which is conducted through the AND gate 37 to become a memory save set signal (SAVEREQ) 65 on the common bus 7a. A memory acknowledge signal (MANS) 61 on the common bus 7a is conducted through the AND gate 48 and sent to the CPU as acknowledge signal (ANS) 55. Read-out data signals (RDi) 60, copy mode signal (CPY MODE) 26 and memory save signal (SAVE) 66 on the common bus 7a are sent through the buffers 46, 47 and 39 to the CPU as read-out data signals (RDi), 53, copy mode signal (CPY MODE) and memory save signal (SAVE) 38, respectively.

Figure 3:
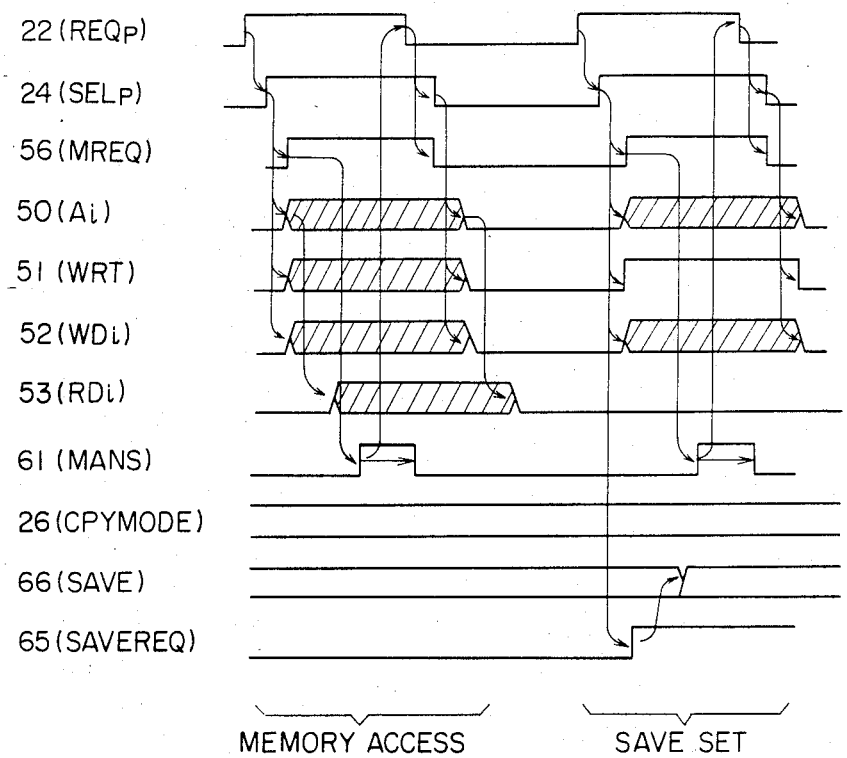
FIG. 3 is a timing chart used to explain the operation of the CPU port shown in FIG. 2.

The decoder 63 receives the address signal 50 and write signal 51, and produces the output signal 64 when (a) the address signal 50 has a special bit pattern which is unused for addressing and (b) the write signal 51 is active. The decoder 63 causes the program of the CPU to provide the memory save set signal 65. In response to the signal 65 becoming active, the memory block with battery backup facility 5 provides the active memory save signal 66. For supplementing the foregoing explanation of FIG. 2, a timing chart of signals on the common bus 7a is shown in FIG. 3.

Figure 4:
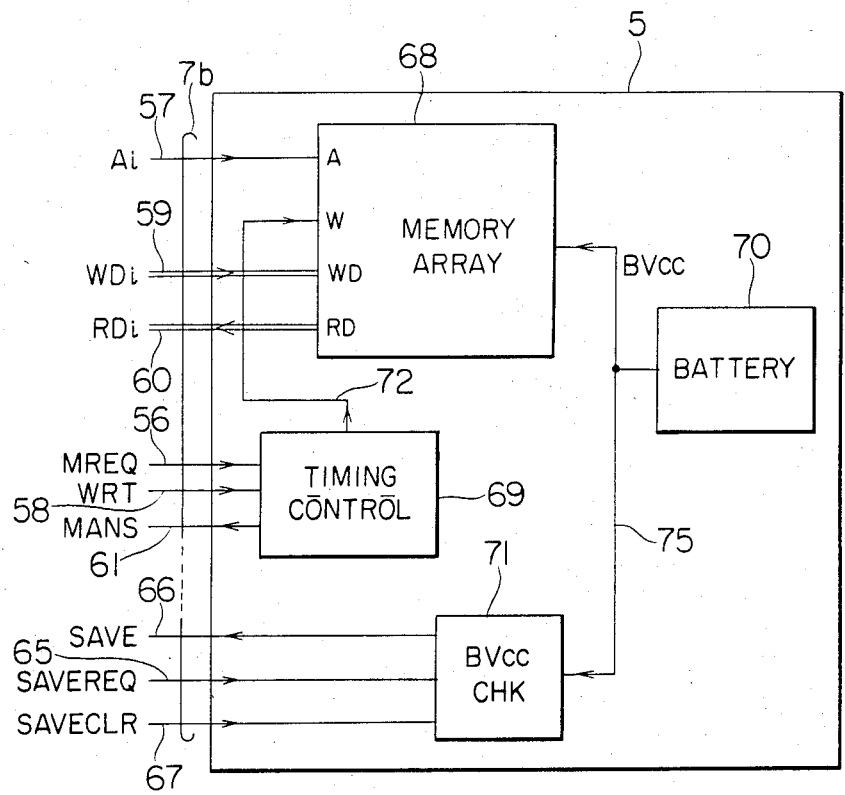
FIG. 4 is a block diagram showing one embodiment of the arrangement of the memory block and associated battery backup facility 5 shown in FIG. 1.
Figure 5:
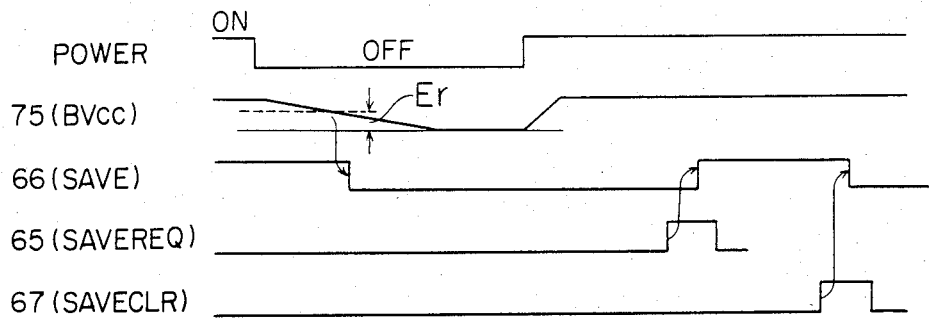
FIG. 5 is a timing chart used to explain the operation of the arrangement shown in FIG. 4.

FIG. 4 shows in detail an embodiment of the memory block with battery backup facility 5. The arrangement consists of a memory array 68 made up of semiconductor memory chips, timing control circuit 69, battery 70, and battery backup monitoring circuit 71. The memory array 68 receives address signals (Ai) 57, write data signals (WRi) 59 and read-out data signals (RDi) 60 on the common bus 7b. The read-out data signals (RDi) 60 represent the contents of a memory location addressed by the address signals (Ai) 57. The timing control circuit 69 receives the memory activation signal (MREQ) 56 and write signal 58, and provides an acknowledge signal 61 and write signal 72. The write signal 72 stays active for a certain period when the memory activation signal 56 and write signal 58 are both active. This signal is applied to the memory array 68, and data represented by the write data signal 59 is written in a memory location addressed by the address signal 57. The acknowledge signal (MANS) 61 becomes active on expiration of a certain period after the activation signal 56 has become active. The battery 70 is charged when the external power supply (not shown) is on, and it discharges to supply power to the memory array 68 as a battery power signal 75 when the external power supply is shut off. The battery backup monitoring circuit (BVcc CHK) 71 memorizes a signal indicating whether battery backup has been successful or not. The memory save signal 66 is made inactive when the battery power signal (BVcc) 75 has fallen below a certain voltage (Er), and it stays inactive when the battery power signal 75 is restored to the original level. On the other hand, the memory save signal (SAVE) 66 becomes active unconditionally when the memory save set signal (SAVE REQ) 65 becomes active, and it becomes inactive unconditionally when the memory save clear signal (SAVE CLR) 67 becomes active. These operations are shown in the timing chart of FIG. 5.

Figure 6:
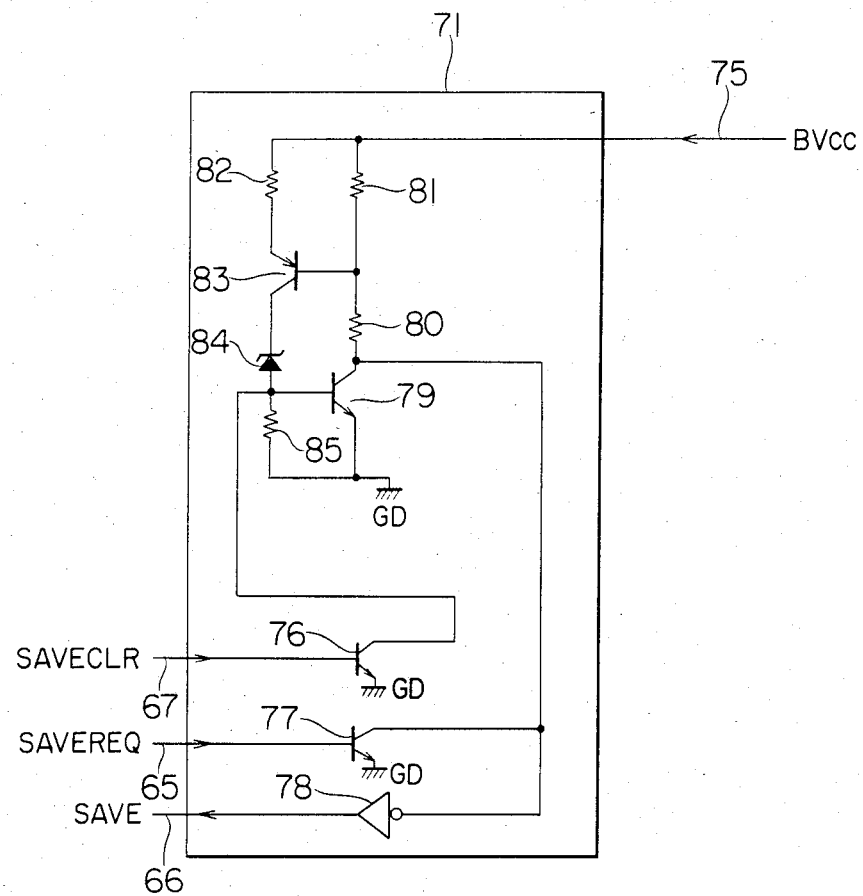
FIG. 6 is a schematic diagram showing one embodiment of the battery backup monitoring facility 71 shown in FIG. 4.

FIG. 6 shows an embodiment of the battery backup monitoring circuit 71. The circuit includes transistors 79 and 83 connected to provide a thyristor function, a zener diode 84 for providing a constant voltage source defining the voltage level to be detected, and resistors 80, 81 and 82 for limiting the current in the transistors 79 and 83. Assuming that the battery power signal 75 is at a normal level and the transistors 79 and 83 are in a conductive state, when the power signal (BVcc) 75 falls due to power failure or discharging of the battery, below a voltage which is the sum of the base-to-emitter voltage $V_{BE}$ of the transistor 79 and the zener voltage $V_{ZD}$ of the zener diode 84, i.e., $V_{BE}+V_{ZD}=Er$, the transistor 79 is cut off and the transistor 83 is also cut off. Once the transistors are cut off, they stay cutoff even if the power signal 75 is restored to the original level. In this state, when the set signal (SAVE REQ) becomes active, the transistor 77 becomes conductive. Consequently, the transistor 83 becomes conductive and then the transistor 79 becomes conductive. Once the transistor 79 becomes conductive, both transistors 79 and 83 stay conductive even if the set signal 65 goes off and the transistor 77 is cut off. In this state, when the clear signal (SAVE CLR) 67 becomes active and the transistor 76 becomes conductive, the transistor 79 is cut off, and then the transistor 83 is also cut off. Once the transistor 83 is cut off, the transistors 79 and 83 stay cutoff even if the clear signal is removed and the transistor 76 is cut off. During the ON period of the transistor 79, the save signal (SAVE) 66 of this memory unit is kept active by the inverter 78, and during the OFF period of the transistor 79, the save signal (SAVE) 66 of this memory unit is made inactive.

Figure 7:
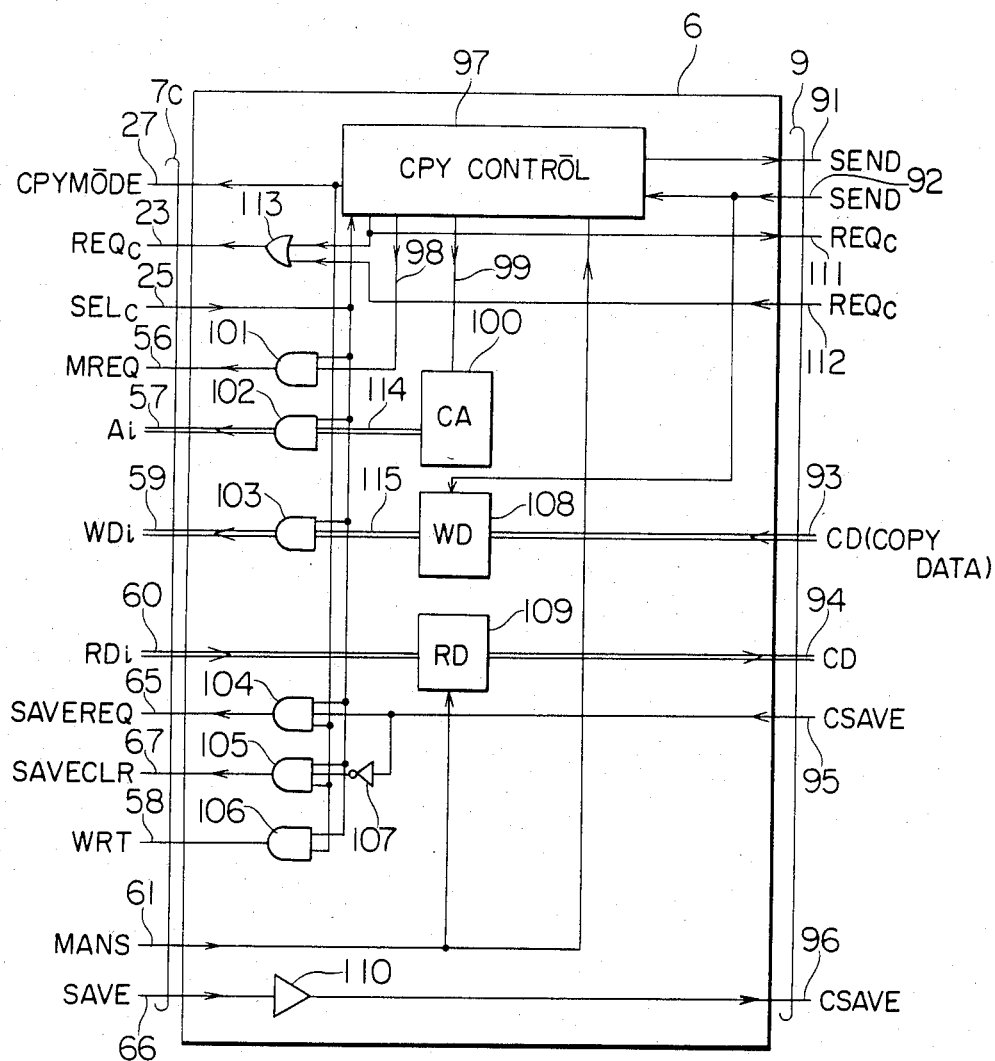
FIG. 7 is a schematic diagram showing one embodiment of the copy port 6 in the memory unit shown in FIG. 1.

FIG. 7 shows an embodiment of the copy attachment 6. This arrangement consists of a copy controller (CPY CONTROL) 97, copy address counter (CA) 100, copy write data register (ED) 108, copy read-out data register (RD) 109, AND gates 101–106, OR gate 113, buffer 110, and inverter 107. The copy controller 97 checks to see whether or not the power of this memory unit is turned on after another memory unit, and if this is true, it performs the following processes so as to copy the contents of another memory unit which has been turned on in advance into the memory of its own unit. First, the copy mode signal (CPY MODE) 27 and copy request signal (REQc) 111 are made active. The signal 111 is ORed with the copy request signal (REQc) 112 of another memory unit by the OR gate 113, so that a common copy request signal (REQc) 23 is placed on the common bus 7c. The bus controller 3 selects one of request signals from the CPU attachments and copy attachment, and if this copy attachment is selected, the enable signal (SELc) 25 is made active. In response to this signal, the memory activation signal 98 which is one of the outputs from the copy controller, the output 114 from the copy address counter 100, and the output 115 from the copy write data register 108 are sent out through respective AND gates 101, 102 and 103 on the common bus 7c as a memory activation signal (MREQ) 56, address signals (Ai) 57 and write data signals (WDi) 59. In the memory unit with its copy reception mode (CPY MODE) active, i.e., copy receiving memory unit, the copy save signal (CSAVE) 95 of the copy sending memory unit is sent out on the common bus through the AND gate 104 as a memory save set signal (SAVE REQ) 65 in response to the enable signal (SEL) 25. At the same time, the memory save signal (CSAVE) 95 is inverted by the inverter 107 and sent out through the AND gate 105 over the common bus 7c as a clear signal (SAVE CLR) 67. Accordingly, when the memory save signal (CSAVE) 95 of another memory unit is active, the save signal (SAVE) 66 of its own memory unit is also active, and if the signal 95 is inactive, the signal 66 is also inactive. In the memory unit with its copy reception mode signal 27 active, i.e., copy receiving memory unit, when the enable signal 25 becomes active, the memory write signal (WRT) 58 is made active through the AND gate 106, and in the memory unit with its copy reception mode signal inactive, i.e., copy sending memory unit, the memory write signal (WRT) 58 stays inactive. The copy controller 97 with its copy reception mode signal 27 being inactive, i.e., copy sending memory unit, makes the memory activation signal 98 active in response to the enable signal (SELc) 25. In consequence, the memory activation signal (MREQ) 56 is made active through the AND gate 101, and the contents of the memory are read out. When the memory acknowledge signal (MANS) 61 becomes active, the read-out data signals (RDi) 60 are loaded into the data register 109, and the output (CD) 94 of the register is transferred to another memory unit. This output is connected to the input 93 of another memory system. In response to the memory acknowledge signal 61, the copy controller 97 makes the copy send signal (SEND) 91 active for a certain duration. The signal 91 is received as a copy send signal (SEND) 92 from another memory unit. After that, the copy controller 97 provides a count-up signal 99 for the copy address counter 100 so as to update the address, and completes the copy operation. The copy address counter 100 is assumed to have an intial value of zero.

Figure 8:
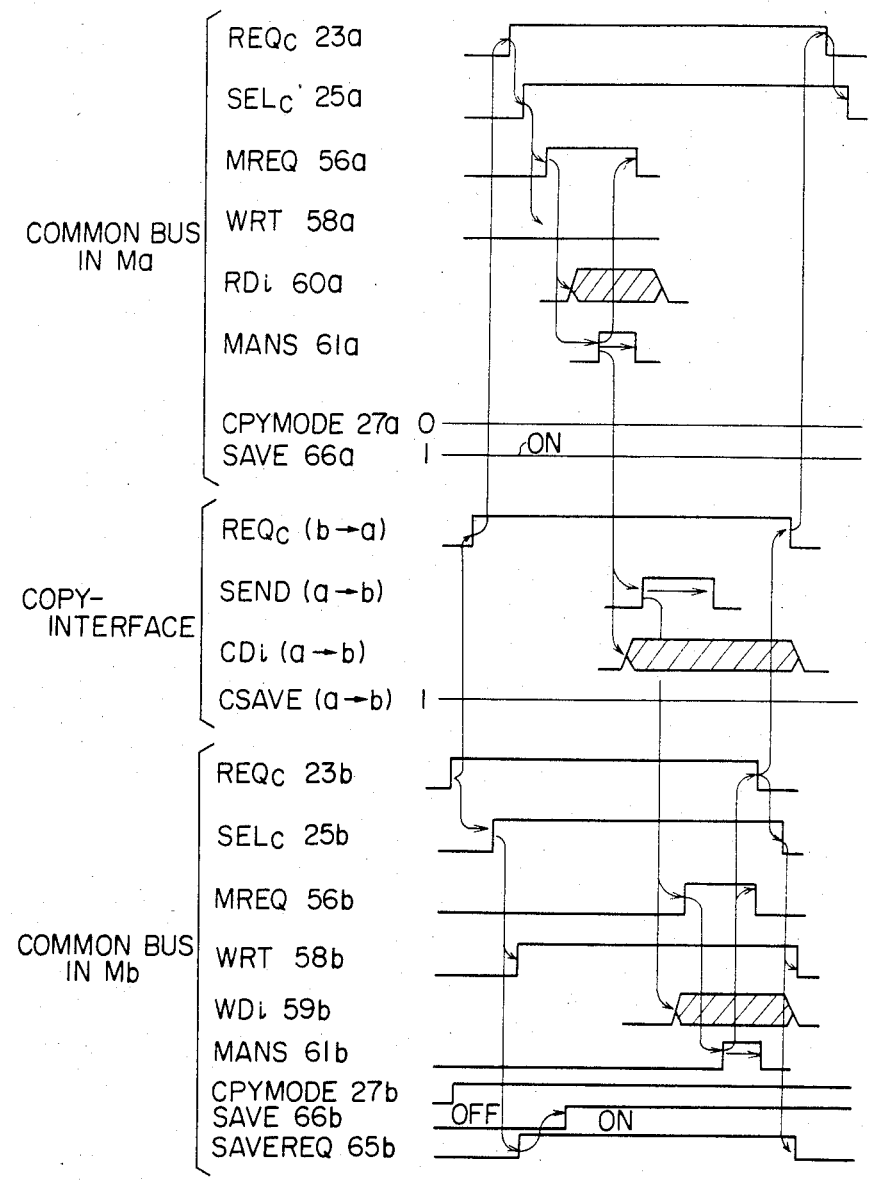
FIG. 8 is a timing chart used to explain the operation of the arrangement shown in FIG. 7.

On the other hand, the copy controller with its copy reception mode signal 27 active, i.e., copy receiving memory unit, waits for the activation of the copy send signal (SEND) 92 after the enable signal (SELc) 25 has become active. In response to the signal 92, the copy controller loads transferred copy data (CD) 93 into the write data register (WD) 108, and causes the memory activation signal 98 to be active. The contents of the write data register 108 are sent out as write data signals (WDi) 59 through the AND gate 103, and memory writing takes place when the memory activation signal 98 becomes active. In response to the memory acknowledge signal 61, the count-up signal 99 of the copy address counter 100 is produced so as to update the address. Unless the new address does not exceed the maximum address, the copy request signal (REQe) 111 is made active again, so that the same procedures are repeated. If the address exceeds the maximum address, the copy reception mode signal 27 is cancelled, and the copy operation is completed. FIG. 8 shows the timing relationship of the signals on the copy interface bus 9 and common bus 7 in the copy operation, supplementing the foregoing explanation of FIG. 7. In FIG. 8, signals of the memory unit Ma are suffixed with "a", and signals in the memory unit Mb are suffixed with "b". The chart shows an example of the operation at a point in time when a copy of stored data from the memory unit Ma to memory unit Mb has been started, with the memory save signal (SAVE) 66a of Ma being active while the signal 66b of Mb being inactive, and the signal 66b makes a transition from the inactive state to active state.

Figure 9:
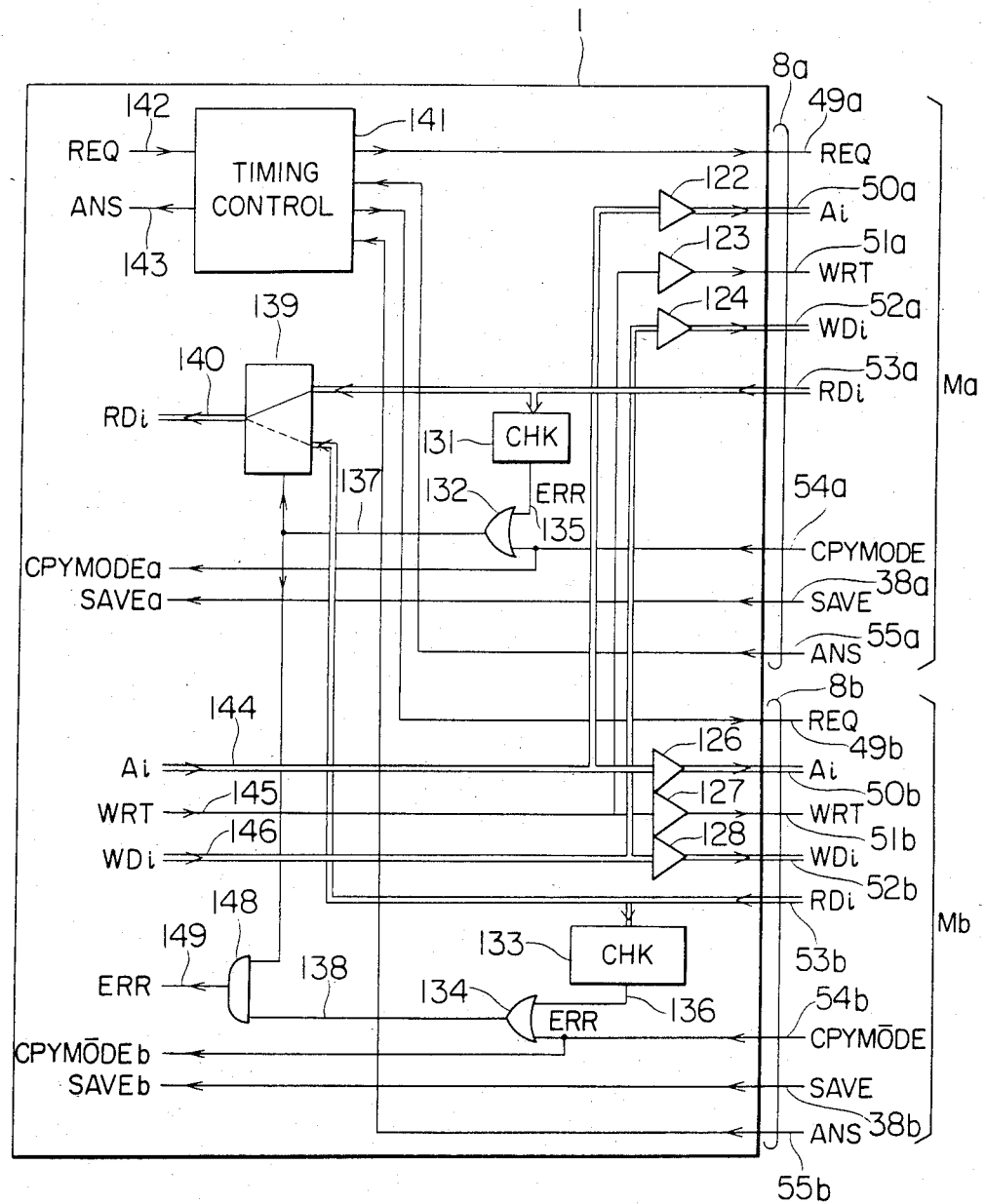
FIG. 9 is a schematic diagram showing one embodiment of the interface circuit of CPU A to the dual memory system shown in FIG. 1.

FIG. 9 shows the dual memory interface on the CPU (A). The arrangement includes a timing control circuit 141, read data selector 139, read data check circuits 131 and 133, buffers 122–124 and 126–128, OR gates 132 and 134, and AND gate 148. In response to a memory request signal (REQ) 142 from the CPU, the timing control circuit 141 issues the memory request signal 49 to both memory units. At the same time, the address signals (Ai) 144, write signal (WRT) 145 and write data signals (WDi) 146 are also transferred to both memory units through the respective buffers 122–124 and 126–128 as address signals (Ai) 50, the write signal (WRT) 51 and write data signals (WDi) 52. Read-out data signals (RDi) 53 from both memory units are checked by the check circuits 131 and 133, and if an error is detected, an error signal 135 or 136 is made active. The copy reception mode signals (COPY MODE) 54 from both memory units are ORed with respective error signals 135 and 136, so that read-out data disable signals 137 and 138 are produced. When the signal 137 is inactive, read-out data 53a from the memory unit Ma is selected, otherwise, read-out data 53b from the memory unit Mb is selected so as to be sent as read-out data (RDi) 140 into the CPU. This arrangement prevents read-out data of the copy-receiving memory unit from being used during the copy operation and allows both memory units to write, whereby automatic copy is realized without sighificantly affecting the processing speed of the CPU. In case read-out data from both memory units are determined to be unusable, the AND gate 148 produces an error message signal 149 to the CPU. Preferably, the copy reception mode signal 54 and memory save signal 38 are delivered to the CPU, so that a program in the CPU can see the state of the dual memory system.

We claim:

1. In a power backed-up dual memory system having first and second memory units each including volatile memory devices receiving power from an individual power supply or from backup power storage means in the case of failure of said power supply, said first and second memory units being adapted to be accessed from one or more processing units simultaneously and controlled so that the volatile memory devices of both memory units normally have the same contents, the improvement comprising a backup monitoring facility provided in each memory unit for monitoring the output voltage of said power storage means and for storing a state indicative of whether backup is in a proper condition as indicated by said output voltage being higher than a predetermined voltage, and means operative when the contents of one memory unit are copied to another memory unit, for causing said stored state in the backup monitoring facility of the receiving memory unit to be made coincident with a state stored in the backup monitoring facility of the sending memory unit.

2. A power backed-up dual memory system according to claim 1, wherein each of said first and second memory units comprises:
   (a) first and second CPU ports connected through respective CpU-memory interface buses to first and second processing units which make access to said memory units for reading and writing data;
   (b) a copy port connected through a copy interface bus to that of another memory unit for transferring data between said first and second memory units;
   (c) a common bus on which are connected said CPU ports, copy port, and volatile memory devices with power backup facility; and
   (d) a bus controller connected to said common bus and adapted to receive memory access requests from said CPU ports and copy port and to allow one of the requests; said backup monitoring facility including a storage means for storing a memory save signal (SAVE) indicative of successful backup, means for outputting said SAVE signal onto said common bus, means for resetting said SAVE signal using a memory save clearing signal (SAVE CLR) provided on said common bus, and means for setting said SAVE signal using a memory save setting signal (SAVE REQ) provided on said common bus.

3. A power backed-up dual memory system according to claim 2, wherein said CPU ports include means for outputting said memory save setting signal (SAVE REQ) in response to a command from respective processing units.

4. A power backed-up dual memory system according to claim 2, wherein said copy interface bus includes signal lines (CSAVE) for transferring said memory save signal (SAVE) between said first and second memory units, said copy port including means for outputting said memory save setting signal (SAVE REQ) or memory save clearing signal (SAVE CLR) depending on the state of the signals on said signal lines (CSAVE).

5. A power backed-up dual memory system according to claim 4, wherein said copy port includes means for outputting a copy mode signal indicative of whether the associated memory unit is a copy sending unit or a copy receiving unit onto said common bus, and means for receiving a memory access enabling signal on said common bus, whereby said memory save setting signal (SAVE REQ) and memory save clearing signal (SAVE CLR) are outputted onto said common bus on condition that the copy mode signal indicates copy reception and the memory access enabling signal is received.

6. A power backed-up dual memory system according to claim 4, wherein said copy port comprises an arrangement which receives said memory save signal (SAVE) on said common bus and sends it out through a signal buffer means onto said signal lines (CSAVE) in said copy interface bus.

* * * * *